(12) United States Patent
Suzuki et al.

(10) Patent No.: US 8,790,950 B2
(45) Date of Patent: Jul. 29, 2014

(54) METHOD OF MANUFACTURING OPTICAL SENSOR, OPTICAL SENSOR, AND CAMERA INCLUDING OPTICAL SENSOR

(75) Inventors: Takanori Suzuki, Tokyo (JP); Tadashi Kosaka, Atsugi (JP); Koji Tsuduki, Kawasaki (JP); Yasuhiro Matsuki, Atsugi (JP); Shin Hasegawa, Hadano (JP); Akiya Nakayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 330 days.

(21) Appl. No.: 13/211,102

(22) Filed: Aug. 16, 2011

(65) Prior Publication Data
US 2012/0050590 A1 Mar. 1, 2012

(30) Foreign Application Priority Data
Aug. 27, 2010 (JP) ................................ 2010-191322

(51) Int. Cl.
*H01L 21/00* (2006.01)
*H01L 27/146* (2006.01)

(52) U.S. Cl.
CPC .... *H01L 27/14618* (2013.01); *H01L 27/14683* (2013.01)
USPC ................................ 438/64; 438/68; 438/458

(58) Field of Classification Search
USPC .............. 438/64, 68, 116, 458; 257/432
See application file for complete search history.

(56) References Cited

U.S. PATENT DOCUMENTS

| 2007/0187791 A1* | 8/2007 | Yamamoto et al. | 257/433 |
| 2007/0267661 A1* | 11/2007 | Tsukada | 257/232 |
| 2012/0199929 A1* | 8/2012 | Kamijyo et al. | 257/432 |

FOREIGN PATENT DOCUMENTS

| CN | 101593762 A | 12/2009 |
| JP | 5-279074 A | 10/1993 |
| JP | 2004296739 A | 10/2004 |
| JP | 2005008509 A | 1/2005 |
| JP | 2005158948 A | 6/2005 |
| JP | 2006303481 A | 11/2006 |
| JP | 2007-258750 A | 10/2007 |
| JP | 2008-034502 A | 2/2008 |
| JP | 2010-050260 A | 3/2010 |

\* cited by examiner

*Primary Examiner* — Daniel Whalen
(74) *Attorney, Agent, or Firm* — Canon U.S.A., Inc., IP Division

(57) ABSTRACT

A method of manufacturing an optical sensor includes providing a semiconductor wafer including a plurality of pixel areas, providing a light transmissive substrate including a light transmissive wafer with a plurality of light transmissive members attached thereto, the plurality of light transmissive members being arranged on a first main surface of the light transmissive wafer and each of plurality of light transmissive members emitting α rays, an amount of the α rays being smaller than or equal to 0.05 c/cm²·h, fixing the light transmissive substrate onto the semiconductor wafer together by a fixing member, and dividing the semiconductor wafer and the light transmissive substrate that are fixed together into individual pieces.

7 Claims, 10 Drawing Sheets

METHOD OF MANUFACTURING OPTICAL SENSOR, OPTICAL SENSOR, AND CAMERA INCLUDING OPTICAL SENSOR

BACKGROUND OF THE INVENTION

1. Field of the Invention

The present invention relates to a method of manufacturing an optical sensor, an optical sensor, and a camera.

2. Description of the Related Art

A solid-state image pickup device, which serves as an optical sensor for an image pickup apparatus, is known. In an optical sensor based on solid-state technology, an image pickup device chip obtained by dividing a wafer into individual chips is encapsulated in a cover member by using a plastic package or a ceramic package having a depression. In such an optical sensor, it is known that, when a glass is used as the cover member, α rays emitted from heavy metals or the like included in the glass adversely affect characteristics of the image pickup device chip. Therefore, a configuration in which a crystal that emits no α rays has been proposed to be used as the cover member of the optical sensor (see Japanese Patent Application Laid-Open No. 2008-34502). Further, a configuration in which a glass that emits small amounts of α rays has also been proposed to be used as the cover member (see Japanese Patent Application Laid-Open No. 05-279074).

WLCSP (wafer level chip size package) is known which is obtained by fixing a wafer-state semiconductor substrate including image pickup devices and a light transmissive substrate together and dividing the fixed substrates into individual chips. A configuration and a manufacturing method of the WLCSP are disclosed, for example, in Japanese Patent Application Laid-Open No. 2010-050260. WLCSP-type optical sensors can be processed collectively at the wafer level, so that the manufacturing cost can be reduced, and a small and thin optical sensor can be realized.

However, when a light transmissive substrate formed of a crystal that emits no α rays or a glass that emits small amounts of α rays is fixed to a wafer, there is a problem that warping of the wafer or light trasmissive substrate or both occurs due to thermal expansion during a manufacturing process and the yield rate decreases. In addition, even after manufacturing, there is a problem that a crack or peeling occurs if warping takes place between the fixed light transmissive substrate and the wafer. Therefore, an optical sensor obtained by dividing the fixed substrate and wafer into individual chips has the same problem.

The present invention provides a manufacturing method of an optical sensor in which influence of α rays to the image pickup device chip can be reduced and warping can be suppressed. Accordingly, the optical sensor, and a camera using the optical sensor can be made more reliable.

SUMMARY OF THE INVENTION

One aspect of present invention is directed to a method of manufacturing an optical sensor. The method includes: providing a semiconductor wafer including a plurality of pixel areas, providing a light transmissive substrate including a light transmissive wafer with a plurality of light transmissive members attached thereto, the plurality of light transmissive members being arranged on a first main surface of the light transmissive wafer and each of the plurality of light transmissive members emitting α rays in an amount smaller than or equal to 0.05 c/cm$^2$·h, fixing the light transmissive substrate onto the semiconductor wafer by a fixing member so that the plurality of light transmissive members and the semiconductor wafer face each other, and dividing the semiconductor wafer and the light transmissive substrate that are fixed together into individual pieces.

Further features of the present invention will become apparent from the following description of exemplary embodiments with reference to the attached drawings.

DESCRIPTION OF THE EMBODIMENTS

Hereinafter, embodiments of the present invention will be described with reference to FIGS. 1 to 6.

First Embodiment

Figure 1A:
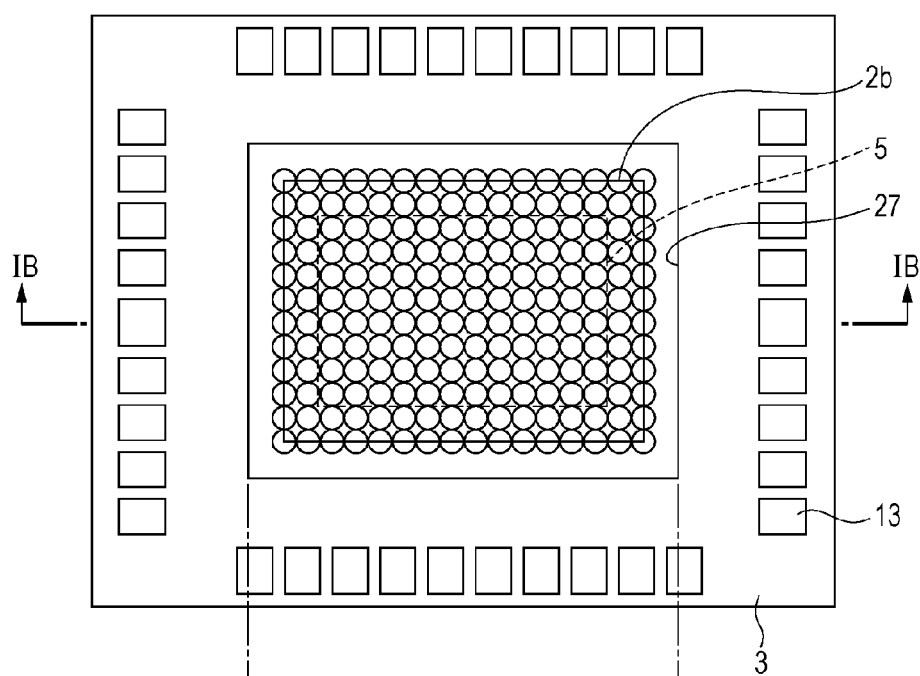
FIG. 1A is a transparent plan view of an optical sensor of a first embodiment.
Figure 1B:
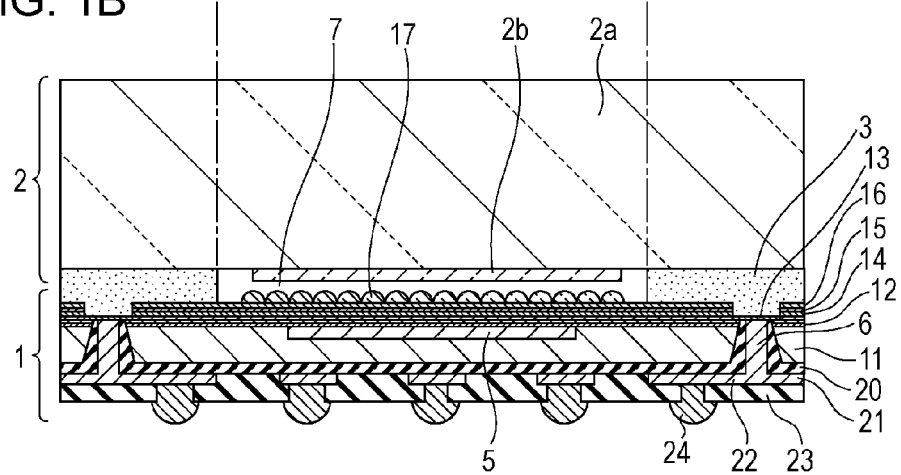
FIG. 1B is a cross-sectional view of the optical sensor of the first embodiment.

FIGS. 1A and 1B are diagrams showing an optical sensor of a first embodiment of the present invention. FIG. 1A is a transparent plan view of the optical sensor. FIG. 1B is a schematic cross-sectional view taken along line IB-IB in FIG. 1A.

According to the first embodiment, the optical sensor includes an image pickup device chip 1 fixed (attached) to a light transmissive cover member 2 via a fixing member 3. A space 7 is formed by being surrounded by the light transmissive cover member 2, the image pickup device chip 1, and the fixing member 3. In contrast to the second embodiment (described below), the space 7 prevents that surfaces of the light transmissive member 2 and the image pickup device chip 1 facing each other are in contact with each other.

The image pickup device chip 1 includes a pixel area 5, which is disposed within an inner area 27 of the fixing member 3. The optical sensor is obtained by fixing the image pickup device chip 1 (formed in a semiconductor wafer) and the light transmissive substrate 2 together by the fixing member 3 and then cutting the fixed elements into individual pieces.

In this embodiment, the image pickup device chip 1 is a complementary metal oxide semiconductor (CMOS) image sensor. The pixel area 5 has a plurality of conversion elements for converting incident light into electric charges and a plurality of transistors in correspondence with the plurality of conversion elements. A wiring structure 12, a first flattening film 14, a color filter 15, a second flattening film 16 are arranged on the semiconductor substrate (wafer) of the image pickup device chip 1. Microlenses 17 are arranged on an upper (outer) surface the semiconductor substrate (on a light incident side of the substrate). An insulating film 20, an electroconductive film 21, and an insulating member 23 are arranged below the semiconductor substrate 11 (on the side opposite to the light incident side). An oxide film, a nitride film, or the like is used for the insulating film 20. Al, Cu, or the like is used for the electroconductive film 21. A solder resist or the like is used for the insulating member 23.

The image pickup device chip 1 includes through-hole electrodes 6 penetrating a first main surface on the side of the light transmissive cover member, which is the light incident side of the semiconductor substrate 11, and a second main surface on the side opposite to the first main surface. The through-hole electrode 6 is formed by a part of the electroconductive film 21. The through-hole electrode 6 is electrically connected to a surface electrode 13 in the wiring structure. The image pickup device chip 1 has wiring lines 22 formed by a part of the electroconductive film 21 in order to connect to a circuit board not shown in the drawings.

Further, the image pickup device chip 1 has connection terminals 24, which are arranged on the opposite side of the light transmissive cover member 2 and electrically connected to the wiring terminals 22, for connecting to an external circuit. Although a solder ball is used for the connection terminal 24, an anisotropic electroconductive member such as ACP, ACF, or NCP can also be used. A silicon substrate is used for the CMOS image sensor, which is the image pickup device chip. Instead of the CMOS image sensor, a CCD image sensor or the like can be used for the image pickup device chip.

The light transmissive cover member 2 shows a configuration after the light transmissive substrate is divided into individual pieces, and includes a glass plate 2a and a light transmissive member 2b which is fixed (attached) to a surface of the glass plate 2a facing the image pickup device chip and emits $\alpha$ rays, the amount of which is smaller (less) than or equal to 0.05 c/cm²·h (counts per square centimeter per hour). If the amount of $\alpha$ rays emitted from the transmissive cover member 2 is greater than 0.05 c/cm²·h, the image pickup device chip 1 may malfunction or image quality may degrade, so the amount of emitted $\alpha$ rays needs to be reduced. It is desired that the light transmissive cover member 2 and the image pickup device chip 1 have linear expansion coefficients similar to each other. However, existing low-$\alpha$-ray glasses used for an optical sensor have linear expansion coefficients largely different from the linear expansion coefficient of the image pickup device chip 1. Therefore, as the light transmissive cover member 2, the glass plate 2a for suppressing warping when being connected to the image pickup device chip 1 and the light transmissive member 2b for reducing irradiation of $\alpha$ rays to the image pickup device chip 1 are combined together. As a material of the glass plate 2a, it is possible to use a material having a linear expansion coefficient near 2.6 ppm/° C. that is a linear expansion coefficient of silicon which is the semiconductor substrate 11 used for the image pickup device chip 1, and specifically, a material having a linear expansion coefficient larger than or equal to 2.0 ppm/° C. and smaller than or equal to 4.0 ppm/° C. can be used. Therefore, as the glass substrate 2a, a borosilicate glass having a linear expansion coefficient of 3.2 ppm/° C. is used. As the borosilicate glass for the glass substrate 2a, Pyrex (registered trademark), Tempax (registered trademark), and the like can be used. These materials used for the glass substrate 2a emit larger amount of $\alpha$ rays than the light transmissive member 2b.

The image pickup device chip 1 and the glass plate 2a have linear expansion coefficients similar to each other, so warping due to change in temperature is suppressed. The light transmissive member 2b is a material emitting a low level of $\alpha$ rays, and further if the glass plate 2a emits $\alpha$ rays, the light transmissive member 2b absorbs the $\alpha$ rays and reduces the $\alpha$ rays, so the influence of $\alpha$ rays to the image pickup device chip 1 can be reduced. The thicker the light transmissive member 2b is, the more effectively the light transmissive member 2b absorbs $\alpha$ rays, and the thickness of 50 μm or more is further preferable. On the other hand, the thickness of the light transmissive member 2b is preferable to be 200 μm or less. Because, if the thickness of the light transmissive member 2b is thicker than 200 μm, the distance between the glass plate 2a and the image pickup device chip increases, and thus the fixing member 3 is thickened, so that the manufacturing becomes difficult. Further, the humidity resistance may be degraded. As the light transmissive member 2b, a low-$\alpha$-ray glass formed of a borosilicate glass having a linear expansion coefficient of about 6 ppm/° C. (parts per million per degree Celsius) is used. As the light transmissive member 2b, it is also possible to use a crystal having a linear expansion coefficient of about 10 ppm/° C., a silicate glass, or the like.

The fixing member 3 is made of an organic material. Specifically, the fixing member 3 is an adhesive material or compound, such as a UV curable liquid adhesive, a thermosetting liquid adhesive, and a sheet adhesive made of a photosensitive film, or the like. For example, the fixing member 3 is formed by patterning. The reason why the manufacturing is difficult when the distance between the glass plate and the image pickup device chip is large is because, when a liquid adhesive is used in a process for forming the fixing member in a desired position, the adhesive spreads easily, and when a sheet adhesive is used, multiple layers of the sheet adhesives need to be stacked.

Figure 2A:
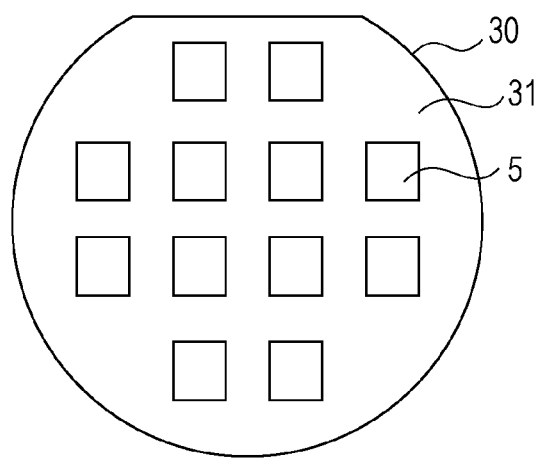
FIGS. 2A and 2B are plan views showing a manufacturing method of the optical sensor of the first embodiment.

Next, a manufacturing method of the optical sensor in FIGS. 1A and 1B will be described with reference to FIGS. 2A to 2H. The configurations shown in FIGS. 2A to 2H are simplified compared with the configuration shown in FIG. 1. First, a semiconductor wafer 30 which includes a plurality of pixel areas 5 and specifically in which a plurality of pixel areas shown in FIG. 1A are formed on a substrate 31 formed of a silicon single crystal is prepared (FIG. 2A). The pixel areas 5 and the like are formed by a general semiconductor device manufacturing process.

Figure 2B:
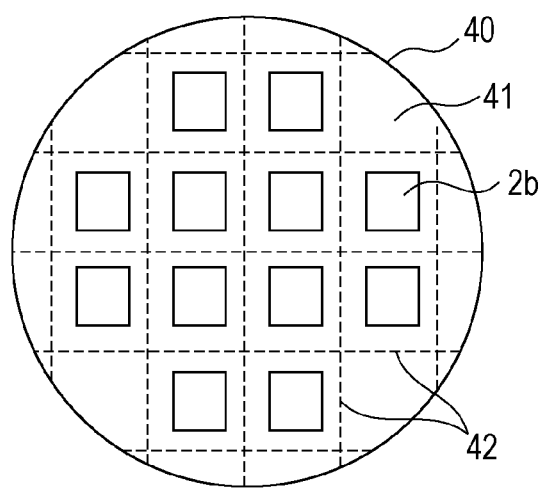
Figure 2C:
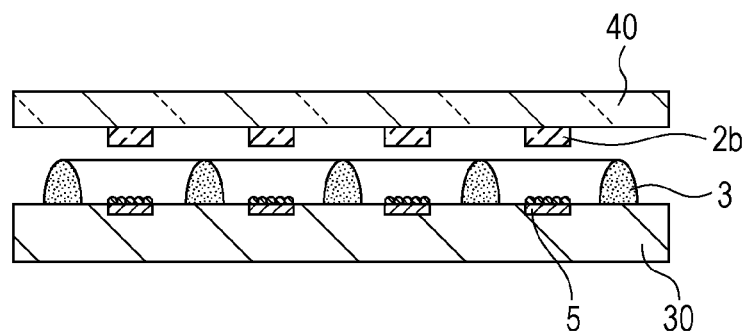
FIGS. 2C to 2H are cross-sectional views showing the manufacturing method of the optical sensor of the first embodiment.

Then, a light transmissive substrate 40 including a light transmissive wafer 41 and a plurality of light transmissive members 2b arranged corresponding to each of the plurality of pixel areas 5 of the semiconductor wafer 30 on a first main surface of the light transmissive wafer 41 is prepared (FIG. 2B). The amount of $\alpha$ rays emitted from each of the plurality of light transmissive members 2b is smaller (lower or less) than or equal to 0.05 c/cm²·h. The light transmissive substrate 40 has substantially the same size as that of the semiconductor wafer 30. In FIG. 2B, reference numeral 42 denotes virtual lines for cutting the light transmissive substrate 40.

Figure 3A:
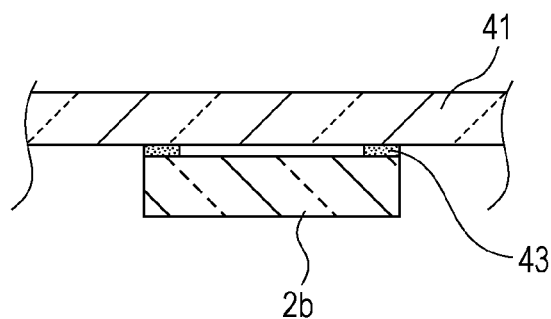
FIGS. 3A and 3B are partial cross-sectional views of the optical sensor of the first embodiment.
Figure 3B:
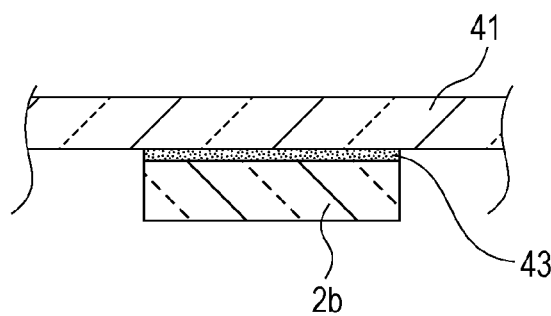

As shown in FIGS. 3A and 3B, the light transmissive wafer 41 and the light transmissive member 2b are fixed together (attached to each other) by an adhesive 43 arranged on marginal areas or an entire surface of the light transmissive member 2b. When the light transmissive wafer 41 and the light transmissive member 2b are fixed together on the marginal areas, a space is formed between the light transmissive wafer 41 and the light transmissive member 2b, and when they are fixed together on the entire surface, a layer of the adhesive 43 is formed between the light transmissive wafer 41 and the light transmissive member 2b (see FIGS. 3A and 3B). In the present embodiment, the light transmissive wafer 41 and the light transmissive member 2b are fixed together on the marginal areas. The light transmissive wafer 41 is a borosilicate glass (Pyrex (registered trademark)) having a thickness of 0.3 mm and a linear expansion coefficient of 3.2 ppm/° C. which is similar to that of silicon. The light transmissive member 2b is a borosilicate glass having a linear expansion coefficient of about 6 ppm/° C. and emits α rays, the amount of which is smaller than or equal to 0.05 c/cm$^2$·h. Although FIGS. 3A and 3B illustrate that the light transmissive wafer 41 and the light transmissive member 2b are attached by an adhesive 43, the light transmissive member 2b can also directly formed on the light transmissive wafer 41, for example, by a vapor deposition method or the like. The light transmissive member 2b is required to be able to reduce α rays entering the pixel area 5 on the semiconductor wafer 30. Therefore, the size of the light transmissive member 2b can be greater than or equal to the size of the pixel area 5 on the semiconductor wafer 30. Further, the size of the light transmissive member 2b can be smaller than the inner area of the fixing member 3 as shown in FIG. 1. The light transmissive wafer 41 emits larger amount of α rays than the light transmissive member 2b.

Next, referring back to FIG. 2C, the fixing member 3 is arranged on the semiconductor wafer in a grid pattern. The fixing member 3 is arranged at a position at which the fixing member 3 surrounds the light transmissive member 2b when the light transmissive substrate 40 is bonded to the semiconductor wafer 30 by using a liquid adhesive. Although, in FIG. 2C, the fixing member 3 is arranged on the semiconductor wafer 30, the fixing member 3 may be arranged on the light transmissive substrate 40 or may be arranged on both the semiconductor wafer 30 and the light transmissive substrate 40.

Figure 2D:
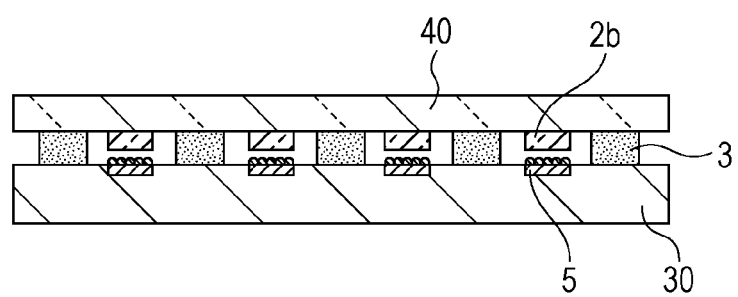

Next, as illustrated in FIG. 2D, the plurality of light transmissive members 2b fixed to the light transmissive wafer 41 and the semiconductor wafer 30 are now facing each other. In this position, the light transmissive substrate 40 and the semiconductor wafer 30 are effectively bonded together by the fixing member. The width "w" of the fixing member 3 can be greater than or equal to 1 mm and smaller than or equal to 2 mm for securing humidity resistance and reducing size.

Figure 2E:
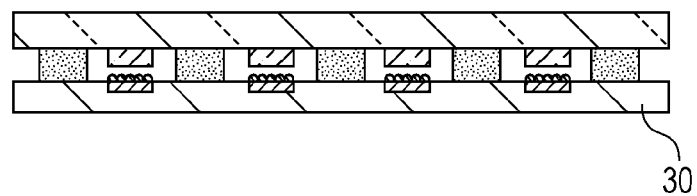

Next, in a state illustrated in FIG. 2E, the thickness of the semiconductor wafer 30 is reduced. As a method for reducing the thickness of the semiconductor substrate, one or more methods are selected from back-grinding, CMP (chemical-mechanical planarization), and etching. The thickness of the semiconductor wafer 30 is reduced from 700 μm before being processed to about 75 μm. When the thickness of the semiconductor wafer 30 is reduced to about 100 μm, in the next process, through-hole electrodes are easily formed.

Figure 2F:
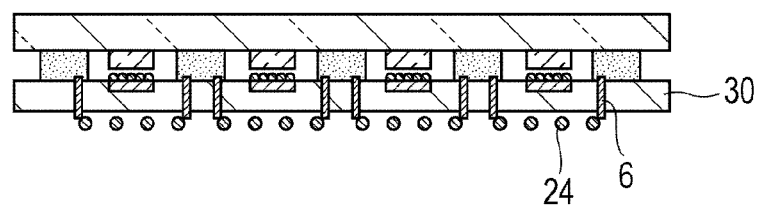

FIG. 2F illustrates a simplified process in which through-hole electrodes 6 are formed in the semiconductor wafer 30. For the through-hole electrode 6, a through-hole is formed by etching in order to make an opening in a wiring portion in multilayer wiring (not shown in the drawings) formed on the surface of the semiconductor wafer. Then, an insulating film such as a silicon oxide film is formed, and the insulating film in the through-hole is etched to make an opening. A through-hole electrode is formed by, for example, Cu plating, and wiring is formed on a surface (back surface) of the semiconductor wafer opposite to the surface facing the light transmissive substrate. Then, a solder resist is formed on the back surface of the semiconductor wafer as an insulating member, an opening is formed on the wiring, and a solder ball is formed as a connection terminal 24.

Figure 2G:
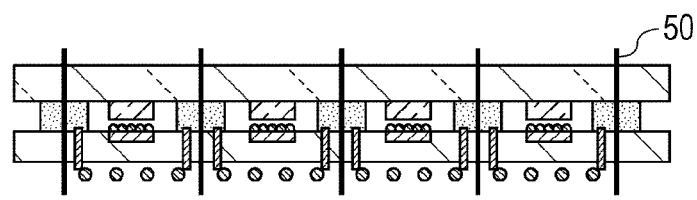
Figure 2H:
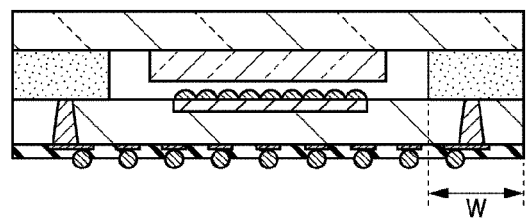

Next, as illustrated in FIG. 2G, the fixed semiconductor wafer and the light transmissive substrate are cut into individual pieces along the virtual lines defined in FIG. 2B. Reference numeral 50 denotes a cutting position. The method for cutting is selected from blade dicing, laser dicing, and the like. The laser dicing has an excellent workability in a thinned semiconductor wafer, can cut the semiconductor wafer with a small width, and can suppress generation of burrs on the cut surface. In a process described above, an optical sensor is completed, as illustrated in FIG. 2H. As described above, influence of α rays to the image pickup device chip can be reduced and warping can be suppressed by the optical sensor of the present embodiment. Also, by the manufacturing method of an optical sensor of the present embodiment, influence of α rays to the image pickup device chip can be reduced, warping of wafer can be suppressed, and warping of an optical sensor cut as an individual piece can be suppressed. Accordingly, production yield rate can be increased.

Second Embodiment

Figure 4A:
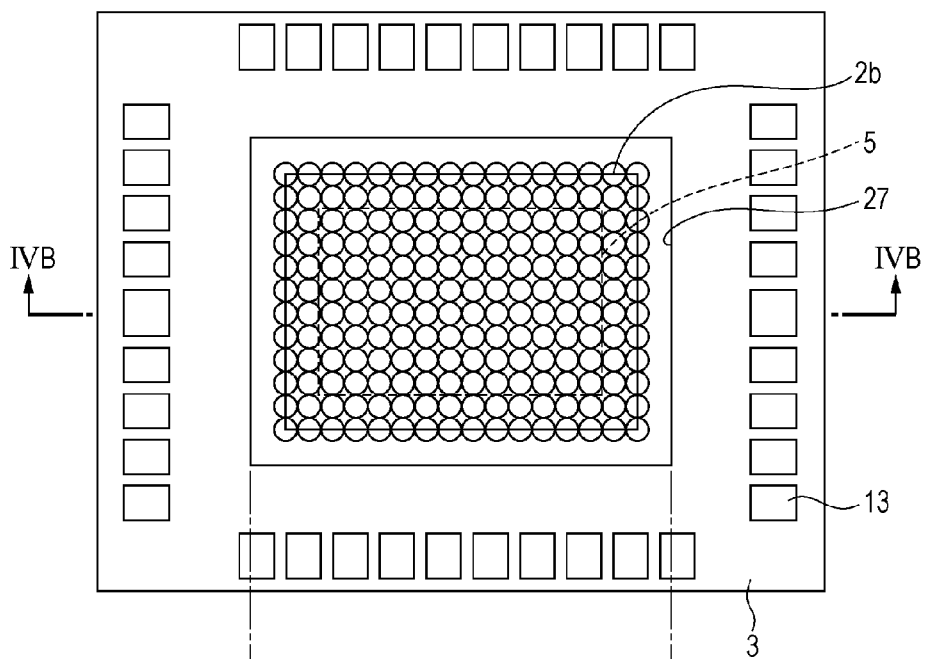
FIG. 4A is a transparent plan view of an optical sensor of a second embodiment.
Figure 4B:
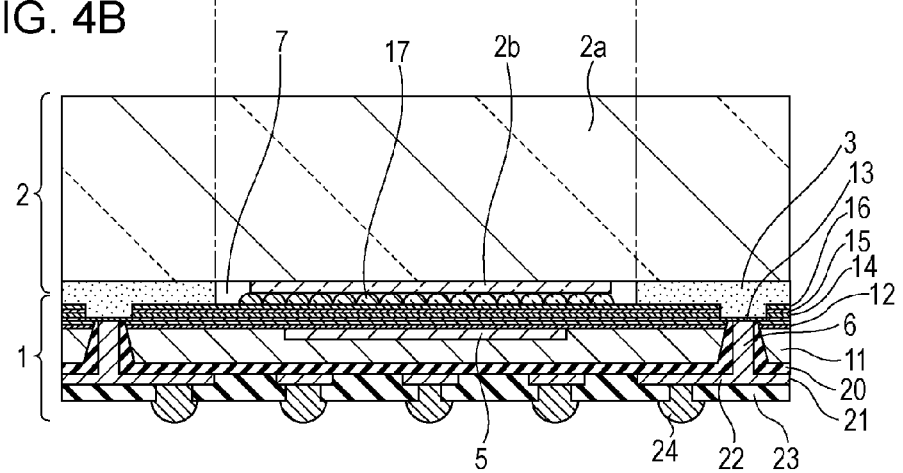
FIG. 4B is a cross-sectional view of the optical sensor of the second embodiment.

FIGS. 4A and 4B are diagrams showing an optical sensor of a second embodiment of the present invention. FIG. 4A is a transparent plan view of the optical sensor. FIG. 4B is a schematic cross-sectional view taken along line IVB-IVB in FIG. 4A.

A difference from the optical sensor in FIGS. 1A and 1B is that at least parts of surfaces of the light transmissive member 2 and the image pickup device chip 1 facing each other are in contact with each other. The same constituent elements as those in FIGS. 1A and 1B are given the same reference numerals and detailed description thereof will be omitted.

As shown in FIG. 4B, a contact between the light transmissive cover member 2 and the image pickup device chip 1 is a contact between the microlenses 17 of the image pickup device chip 1 and the light transmissive member 2b. Here, the contact between the microlenses 17 and the light transmissive member 2b includes a configuration in which the microlenses 17 and the light transmissive member 2b are in direct contact with each other and a configuration in which the microlenses 17 and the light transmissive member 2b are in contact with each other via an antireflection coating film or the like.

By such a configuration, when thinning the silicon substrate of the image pickup device chip 1, the strength increases. Therefore, a possibility of deformation such as warping and crack can be suppressed.

Next, a manufacturing method of the optical sensor in FIGS. 4A and 4B will be described with reference to FIGS. 5A to 5H. FIGS. 5A to 5H are simplified in the same manner as FIGS. 2A to 2H. When the manufacturing method shown in FIGS. 5A to 5H is the same as that shown in FIGS. 2A to 2H, the manufacturing method will be briefly described, and differences between the manufacturing methods will be described in detail.

Figure 5A:
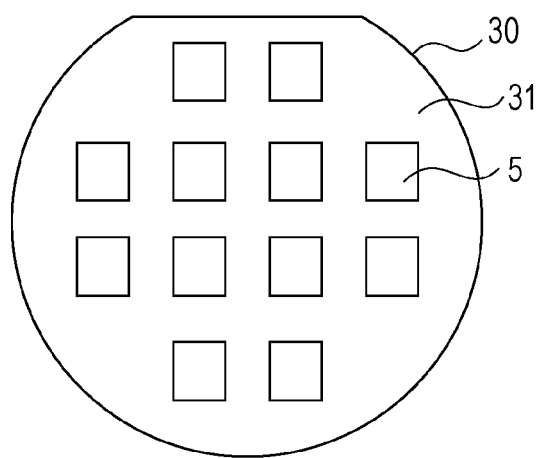
FIGS. 5A and 5B are plan views showing a manufacturing method of the optical sensor of the second embodiment.

First, as illustrated in FIG. 5A, a semiconductor wafer 30 which includes a plurality of pixel areas 5 and specifically in which a plurality of pixel areas shown in FIG. 4A are formed on a semiconductor wafer formed of a silicon single crystal is prepared. The microlenses 17 are formed on a first main surface (upper most surface) of the semiconductor wafer 30.

Figure 5B:
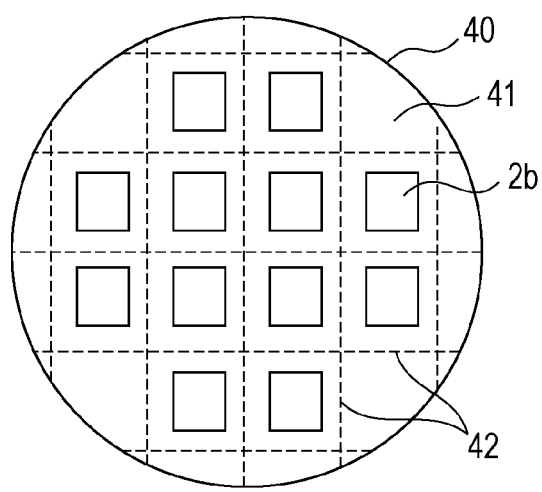

Then, as illustrated in FIG. 5B, a light transmissive substrate 40 including a light transmissive wafer 41 and a plurality of light transmissive members 2b arranged corresponding to each of the plurality of pixel areas 5 of the semiconductor wafer 30 on a first main surface of the light transmissive wafer 41 is prepared. The amount of α rays emitted from the light transmissive member 2b is smaller than or equal to 0.05 c/cm²·h.

Figure 5C:
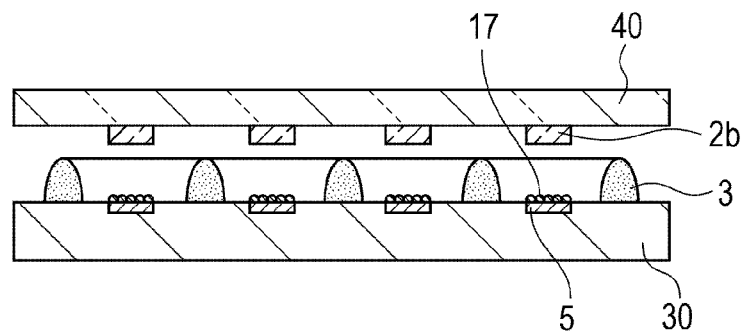
FIGS. 5C to 5H are cross-sectional views showing the manufacturing method of the optical sensor of the second embodiment.

Next, the fixing member 3 is arranged on the semiconductor wafer in a grid pattern (FIG. 5C). The fixing member 3 is arranged at a position at which the fixing member 3 surrounds the light transmissive member 2b when the light transmissive substrate 40 is bonded to the semiconductor wafer 30 by using a liquid adhesive.

Figure 5D:
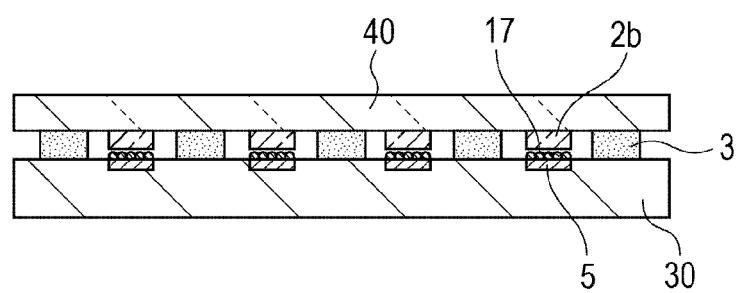

Next, the plurality of light transmissive members 2b on the light transmissive substrate 40 and the semiconductor wafer 30 are faced each other, and the light transmissive substrate 40 and the semiconductor wafer 30 are bonded together by the fixing member 3 (FIG. 5D). At this time, at least parts of surfaces of the plurality of light transmissive members 2b and the semiconductor wafer 30 facing each other are in contact with each other. More specifically, since the microlenses 17 are formed on the upper most surface of the semiconductor wafer 30, the light transmissive member 2b and the microlenses 17 are in contact with each other.

Figure 5E:
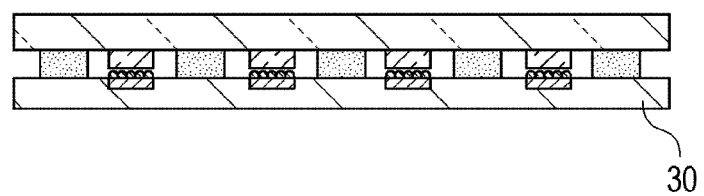
Figure 5F:
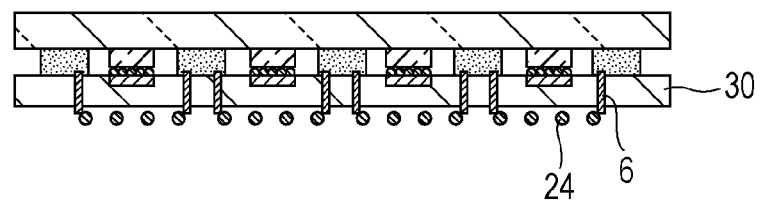

Next, the thickness of the semiconductor wafer is reduced (FIG. 5E). The thickness of the semiconductor wafer 30 is thinned so that the total thickness of the semiconductor wafer is thinned to be about 100 µm in order to effectively form the through-hole electrode 6. However, generally, in a configuration in which a hollow portion, that is, a space, is formed between the light transmissive substrate 40 and the semiconductor wafer 30, when the thinning proceeds, the hollow portion can be dented by pressure from, for example, a grinding stone. Accordingly, if the pressure for thinning the distance between the semiconductor wafer 30 and the light transmissive substrate 40 is not properly controlled, this may represent a problem in that the wafer may be locally deformed or cracked. Because of this problem, the size of the sensor is difficult to be enlarged. In the present embodiment, by closely contacting the light transmissive substrate 40 and the semiconductor wafer 30, depression in the space is reduced, so that possible deformation or cracks are prevented in the thinning process of the semiconductor wafer 30. Therefore, a large-sized optical sensor can be obtained. Here, the large-sized optical sensor mainly means an image sensor whose angle of view is Four Thirds System of 17.3×13 mm or more. For example, the large-sized optical sensor has a size of APS-C of about 22.3×14.9 mm, a full size of about 36.0×24 mm, or a medium size.

Next, returning to FIG. 5F, through-hole electrodes 6 are formed in the semiconductor wafer and wiring is formed on a surface (back surface) of the semiconductor wafer 30 opposite to the surface facing the light transmissive substrate (FIG. 5F). Then, a solder resist is formed on the back surface of the semiconductor wafer as an insulating member, an opening is formed on the wiring, and a solder ball is formed as a connection terminal 24.

Figure 5G:
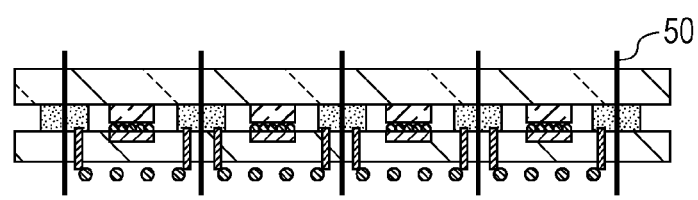
Figure 5H:
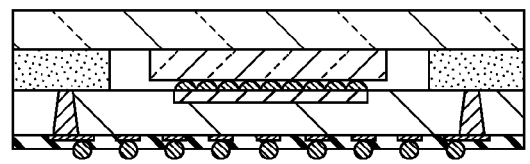

Next, the fixed semiconductor wafer 30 and the light transmissive substrate 40 are cut into individual pieces (FIG. 5G). In the processes described above, an optical sensor is completed (FIG. 5H).

As described above, influence of α rays to the image pickup device chip can be reduced and warping can be further suppressed by the optical sensor of the present embodiment. Also, by the manufacturing method of an optical sensor of the present embodiment, influence of α rays to the image pickup device chip can be reduced, warping of wafer can be further suppressed, and warping of an optical sensor cut as an individual piece can be suppressed, so that the lowering of the yield rate can be suppressed.

Third Embodiment

Application to Digital Camera

Figure 6:
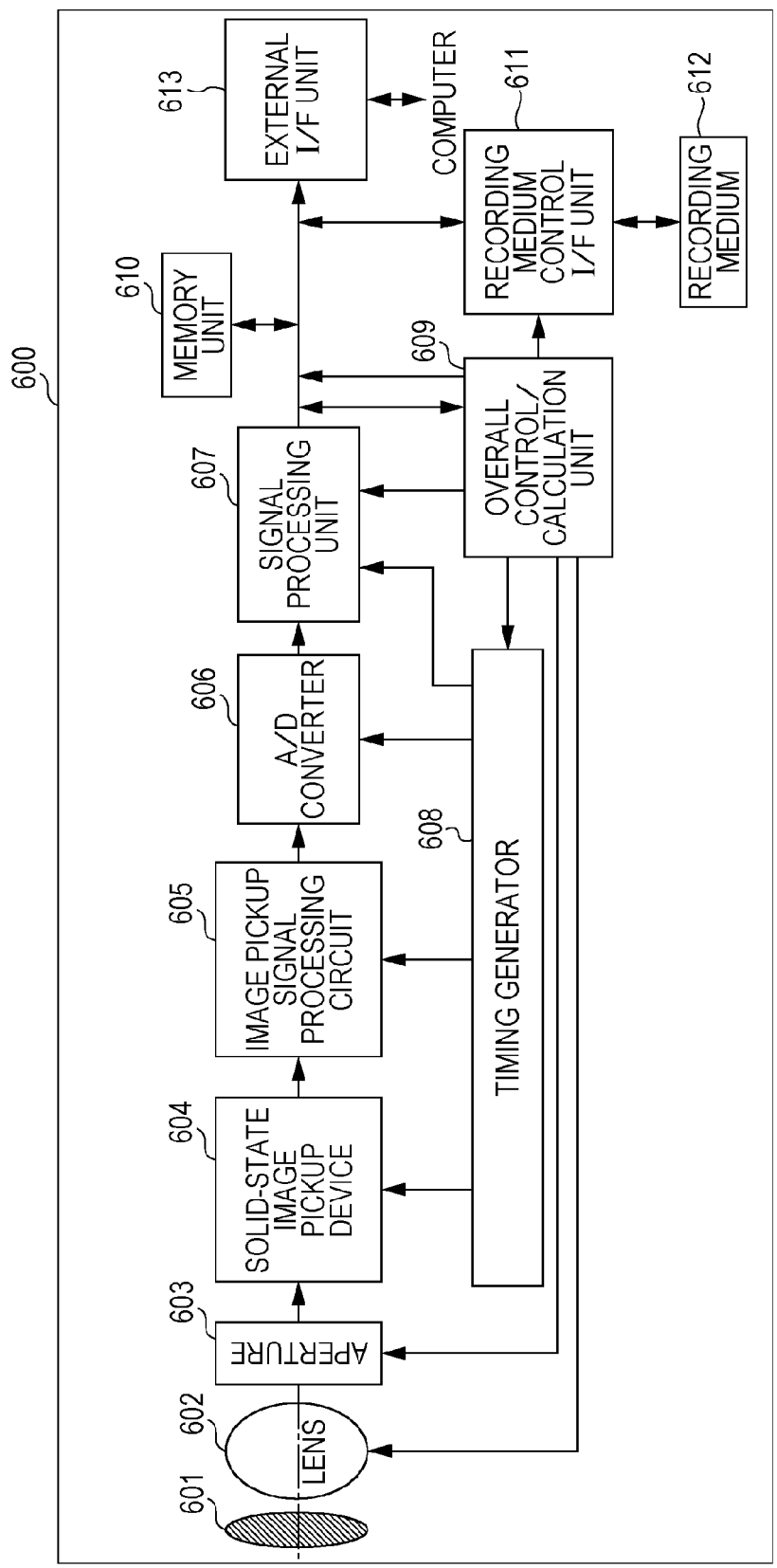
FIG. 6 is a block diagram in which an optical sensor is applied to a digital camera, which is an example of an image pickup system.

FIG. 6 is a block diagram in which the optical sensor described in the first or the second embodiment of the present invention is applied to a digital camera, which is an example of an image pickup apparatus 600. In the image pickup apparatus 600, a solid-state image pickup device 604 is implemented by any of the first or second embodiments of the optical sensor described above.

A configuration for focusing light onto the solid-state image pickup device 604 includes a shutter 601, an image pickup lens 602, and an aperture 603. The shutter 601 controls exposure of the solid-state image pickup device 604, and the incident light is focused on the solid-state image pickup device 602 by the image pickup lens 604. At this time, the light quantity is controlled by the aperture 603.

A signal outputted from the solid-state image pickup device 604 according to the light brought in is processed in an image pickup signal processing circuit 605 and converted from an analog signal to a digital signal by an A/D converter 606. The A/D converter 606 may be integrated in the solid-state image pickup device. The outputted digital signal is calculated by a signal processing unit 607 and picked-up image data is generated. The picked-up image data can be accumulated in a memory 610 mounted in the digital camera or transmitted to an external device such as a computer or a printer through an external I/F unit 613 according to an operation mode set by a user. The picked-up image data can also be recorded in a recording medium 612, such as a memory card or the like, that can be attached and detached to and from the digital camera through a recording medium control I/F unit 611.

The solid-state image pickup device 604, the image pickup signal processing circuit 605, the A/D converter 606, and the signal processing unit 607 are controlled by a timing generator 608, and the entire system is controlled by an overall control/calculation unit 609, which can be implemented by a microprocessor or the like. The above system can also be formed on the same semiconductor substrate as that of the solid-state image pickup device 604 by the same process. As described above, by using the configurations of the embodiments, it is possible to provide a manufacturing method of an optical sensor in which influence of α rays to the image pickup device chip can be reduced and warping can be suppressed, the optical sensor, and a camera using the optical sensor. The embodiments described above can be properly combined or properly modified.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-191322 filed Aug. 27, 2010, which is hereby incorporated by reference herein in its entirety.

What is claimed is:

1. A method of manufacturing an optical sensor, comprising:
   providing a semiconductor wafer including a plurality of pixel areas;
   providing a light transmissive substrate including a light transmissive wafer with a plurality of light transmissive members attached thereto, the plurality of light transmissive members being arranged on a first main surface of the light transmissive wafer and each of the plurality of light transmissive members emitting α rays, an amount of the α rays being smaller than or equal to 0.05 $c/cm^2 \cdot h$ (counts per square centimeter per hour);

fixing the light transmissive substrate onto the semiconductor wafer by a fixing member so that the plurality of light transmissive members and the semiconductor wafer face each other; and dividing the fixed semiconductor wafer and the light transmissive substrate into individual pieces, wherein the light transmissive members are formed of silicate glass.

2. The method according to claim 1, wherein providing the semiconductor wafer includes preparing the semiconductor wafer having microlenses, the microlenses being arranged on the semiconductor wafer at positions corresponding to the plurality of pixel areas.

3. The method according to claim 1, wherein after fixing the light transmissive substrate onto the semiconductor wafer by the fixing member, at least a part of surface of the plurality of light transmissive members is in contact with at least a part of a surface of the semiconductor wafer.

4. The method according to claim 1, wherein in the fixing the light transmissive substrate and the semiconductor wafer, the fixing member surrounds each of the plurality of light transmissive members.

5. The method according to claim 1, wherein in the light transmissive substrate, the thickness of the plurality of light transmissive members is greater than or equal to 50 μm.

6. The method according to claim 1, wherein in the providing the light transmissive substrate, the light transmissive substrate has the light transmissive wafer that emits α rays, amount of the α rays being greater than the amount of the α rays emitted from the plurality of light transmissive members.

7. The method according to claim 1, wherein in the providing the light transmissive substrate the light transmissive substrate has a linear expansion coefficient, the linear expansion coefficient of the light transmissive wafer being greater than or equal to 2.0 ppm/° C. and smaller than or equal to 4.0 ppm/° C., and in the providing the semiconductor wafer, the semiconductor wafer is made of silicon.

\* \* \* \* \*